US011448666B2

(12) United States Patent
Kraft et al.

(10) Patent No.: US 11,448,666 B2
(45) Date of Patent: *Sep. 20, 2022

(54) LIGHTED PROBE FOR ELECTRICAL TESTING DEVICE

(71) Applicant: Dynamic Product Solutions LLC, Monument, CO (US)

(72) Inventors: Robert Alan Kraft, Monument, CO (US); James H. Adcox, Rockwall, TX (US)

(73) Assignee: DYNAMIC PRODUCT SOLUTIONS LLC, Monument, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 17/020,588

(22) Filed: Sep. 14, 2020

(65) Prior Publication Data

US 2021/0063441 A1 Mar. 4, 2021

Related U.S. Application Data

(63) Continuation of application No. 16/688,050, filed on Nov. 19, 2019, now Pat. No. 10,775,410.

(60) Provisional application No. 62/893,334, filed on Aug. 29, 2019.

(51) Int. Cl.
*G01R 1/067* (2006.01)
*G01R 19/25* (2006.01)
*F21L 4/00* (2006.01)

(52) U.S. Cl.
CPC .......... *G01R 1/06788* (2013.01); *F21L 4/005* (2013.01); *G01R 19/2503* (2013.01)

(58) Field of Classification Search
None
See application file for complete search history.

(56) References Cited

U.S. PATENT DOCUMENTS

| | | | |
|---|---|---|---|
| 1,639,889 A | 8/1927 | Humm | |
| 2,229,927 A | 1/1941 | Kamper | |
| 5,672,964 A | 9/1997 | Vinci | |
| 6,377,054 B1 | 4/2002 | Beha | |
| 7,595,628 B1 | 9/2009 | Hertz et al. | |
| 7,718,906 B2 | 5/2010 | Au et al. | |
| 7,868,634 B2 | 1/2011 | Boss et al. | |
| 9,366,699 B2 | 6/2016 | Hamm et al. | |
| 10,775,410 B1 | 9/2020 | Kraft et al. | |
| 2007/0229099 A1* | 10/2007 | Campbell | G01R 1/06788 324/755.01 |
| 2009/0206859 A1 | 8/2009 | Swaim et al. | |

(Continued)

OTHER PUBLICATIONS

FLUKE L200 Probe Light; https://www.myflukestore.com/p1831/fluke_l200_probe_light.php.

*Primary Examiner* — Douglas X Rodriguez
(74) *Attorney, Agent, or Firm* — Jacob M. Ward; Ward Law Office LLC

(57) ABSTRACT

A probe for an electrical testing device has an independently powered integrated light source. The probe has a plurality of lights oriented in a cross-like configuration and housed in a recessed surface of the probe. The plurality of lights projects light beams that extend toward the tip of the probe and illuminate the area directly in front of the tip from 360 degrees. The integrated light source is connected to a power source that is housed in the probe but is independent from the power source used for the electrical testing device.

18 Claims, 4 Drawing Sheets

(56) References Cited

U.S. PATENT DOCUMENTS

| | | | |
|---|---|---|---|
| 2009/0212938 A1* | 8/2009 | Swaim | G01R 1/06788 340/539.1 |
| 2011/0063820 A1* | 3/2011 | Wang | B25B 23/18 362/120 |
| 2015/0362530 A1* | 12/2015 | Hamm | G01R 11/04 324/157 |

* cited by examiner

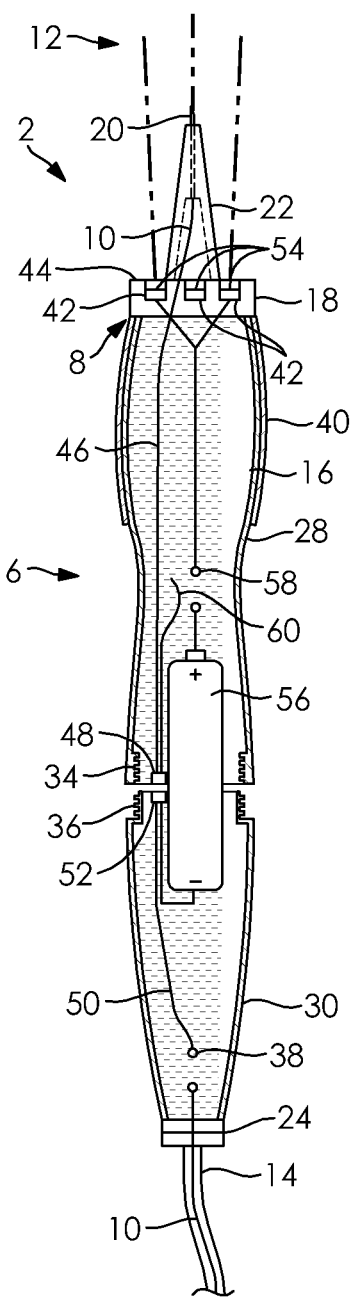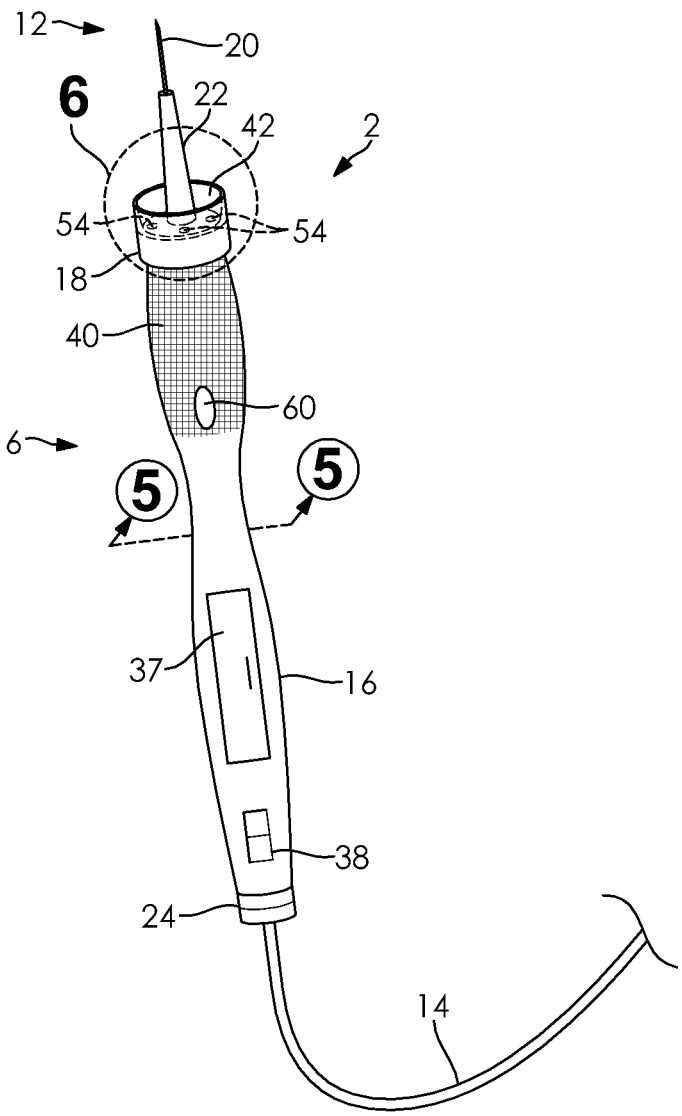
FIG. 3
FIG. 4

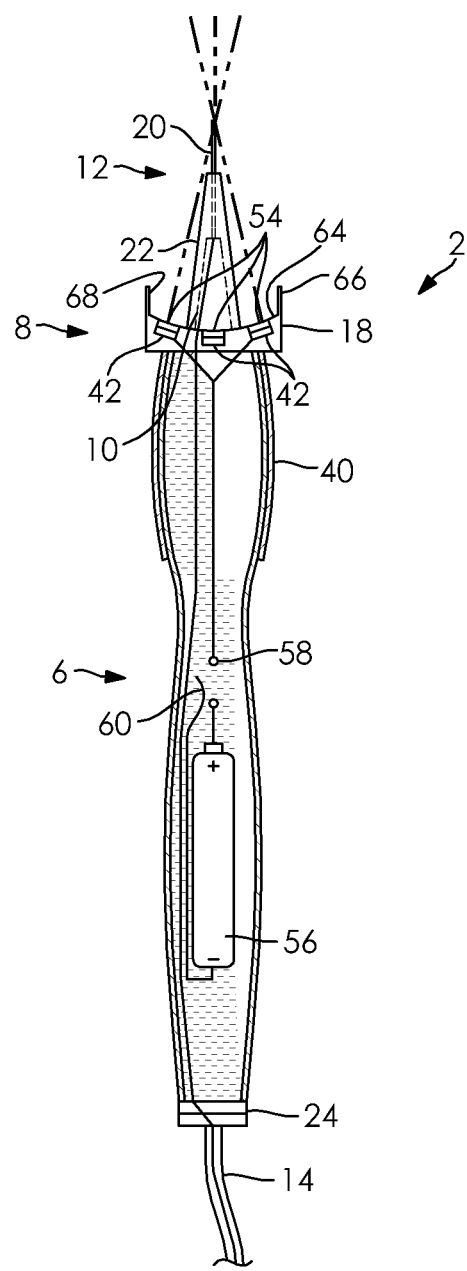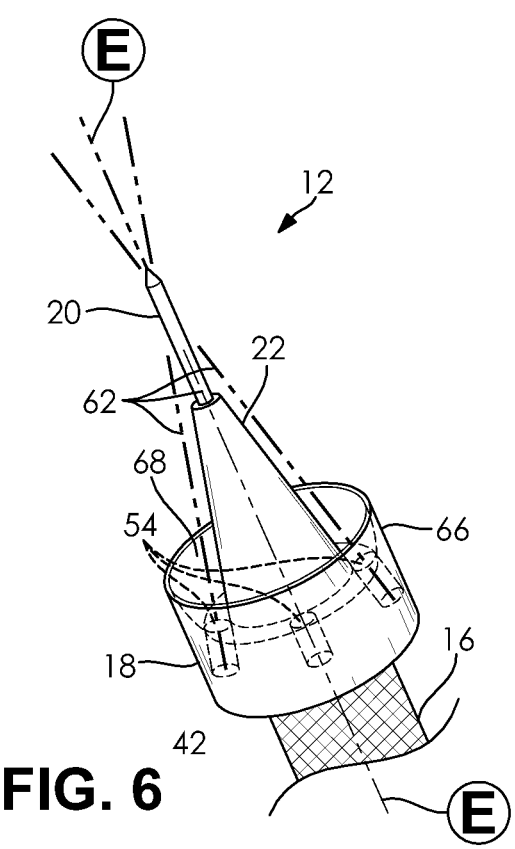
FIG. 5
FIG. 6

LIGHTED PROBE FOR ELECTRICAL TESTING DEVICE

CROSS-REFERENCE TO RELATED APPLICATIONS

This application is a continuation of U.S. patent application Ser. No. 16/688,050, filed Nov. 19, 2019, and issued as U.S. Pat. No. 10,775,410 on Sep. 15, 2020, which in turn claims the benefit of U.S. Provisional Application Ser. No. 62/893,334, filed on Aug. 29, 2019. The entire disclosures of the above applications are hereby incorporated herein by reference.

FIELD

The present disclosure relates generally to electrical testing devices and, more specifically, to an integrated test probe and independently powered light source for an electrical testing device.

BACKGROUND

Electrical testing devices are used to test a wide range of electrical functions including voltage levels, amperage, continuity, polarity, and more. These devices are commonly used in residential and commercial settings by professional electricians and do-it-yourself homeowners.

It is known for electrical testing devices to be used in dark and difficult to reach spaces. When using an electrical testing device without a light source, it can be difficult to locate and perform a test on a specific area, wire, or terminal. Also, in poorly lit conditions the electrical testing device tip may come into contact with an unintended surface. Projects become inefficient, equipment can be damaged, and serious safety hazards are of concern under such conditions.

There are known electrical testing devices that are used with a light source. For example, a pistol grip voltage probe testing device featuring visual output indicators that can be used to illuminate a work area is described in U.S. Pat. No. 5,672,964 to Vinci. Similarly, U.S. Pat. No. 7,595,628 to Hertz et al. teaches an electrical testing device with a light source positioned on the front of the device. In a further example, U.S. Pat. No. 7,868,634 to Boss et al. describes a testing device with a recessed light source near the tip of the testing device.

While these known light sources for electrical testing devices are an improvement over electrical testing devices that do not have a light source, there are known deficiencies with these devices. For example, the location and positioning of the light source on or near the electrical testing device may result in illumination of unintended areas. Additionally, the user may have difficulty seeing the desired area, wire, or terminal due to shadows cast from the testing device itself. Furthermore, known electrical testing devices lack versatility and are limited by the device to which they connect to. These known electrical testing devices are also limited in that the light source is powered by the power source used to activate the electrical testing device and, as such, the light source cannot be used independently from the electrical testing device.

There is a continuing need for a versatile lighted probe for an electrical testing device that is accurate and easy to use. Desirably, the lighted probe contains an independently powered integrated light source.

SUMMARY

In concordance with the instant disclosure, a versatile lighted probe for an electrical testing device that is accurate and easy to use, and which contains an independently powered integrated light source, has surprisingly been discovered.

In one embodiment, a lighted probe for an electrical testing device has a hollow main body, a light source housing, a probe tip, and an integrated light source. The hollow main body has a first end, a second end, and a handle portion. The first end, the second end, and the handle portion are all arranged on an elongate axis. The handle portion is disposed between the first end and the second end. The light source housing is disposed on the first end of the hollow main body. The probe tip has a conductive end and a non-conductive end. The conductive end is arranged on the elongate axis of the hollow main body. The non-conductive end of the probe tip is disposed on the light source housing at the first end of the hollow main body. The integrated light source is disposed in the light source housing of the hollow main body. The integrated light source is configured to direct light beams toward the conductive end of the probe tip.

In another embodiment, the lighted probe further includes an electrical testing device wire and a light power source. The wire is disposed in the hollow main body and extends from the conductive end of the probe tip at the first end of the hollow main body, through nonconductive end of the probe tip and the hollow main body, and to the second end of the hollow main body. The wire is configured to transfer one of a signal and data from the probe tip to the electrical testing device. The integrated light source is in selective electrical communication with the light power source. The light power source is independent from a device power source connected to the electrical testing device in operation.

In a further embodiment, the integrated light source includes a plurality of lights arranged around the probe tip. The plurality of lights are oriented in a cross-like configuration at the light source housing adjacent the non-conductive end of the tip. In particular, the plurality of lights includes a first pair of lights and a second pair of lights. The first pair of lights is disposed on a first axis and the second pair of lights is disposed on a second axis. The first axis oriented orthogonal with the second axis.

In yet another embodiment, a lighted probe and electrical testing device combination includes the electrical testing device, such as a multimeter, in wired or wireless communication with the lighted probe. The electrical testing device receives one of signals and data from the conductive end of the probe tip of the lighted probe in operation.

DRAWINGS

The above, as well as other advantages of the present disclosure, will become readily apparent to those skilled in the art from the following detailed description, particularly when considered in the light of the drawings described hereafter.

FIG. 3 is a cross-sectional front elevational view of the lighted probe taken at section line 3-3 in FIG. 1;

FIG. 4 is a front elevational view of the lighted probe for the electrical testing device according to another embodiment of the present disclosure;

FIG. 5 is a cross-sectional front elevational view of the lighted probe for the electrical testing device taken at section line 5-5 in FIG. 4;

FIG. 6 is an enlarged fragmentary top perspective view of the lighted probe for the electrical testing device taken at call-out 7 in FIG. 4, and further showing a housing and a tip of the lighted probe.

DETAILED DESCRIPTION

Figure 1:
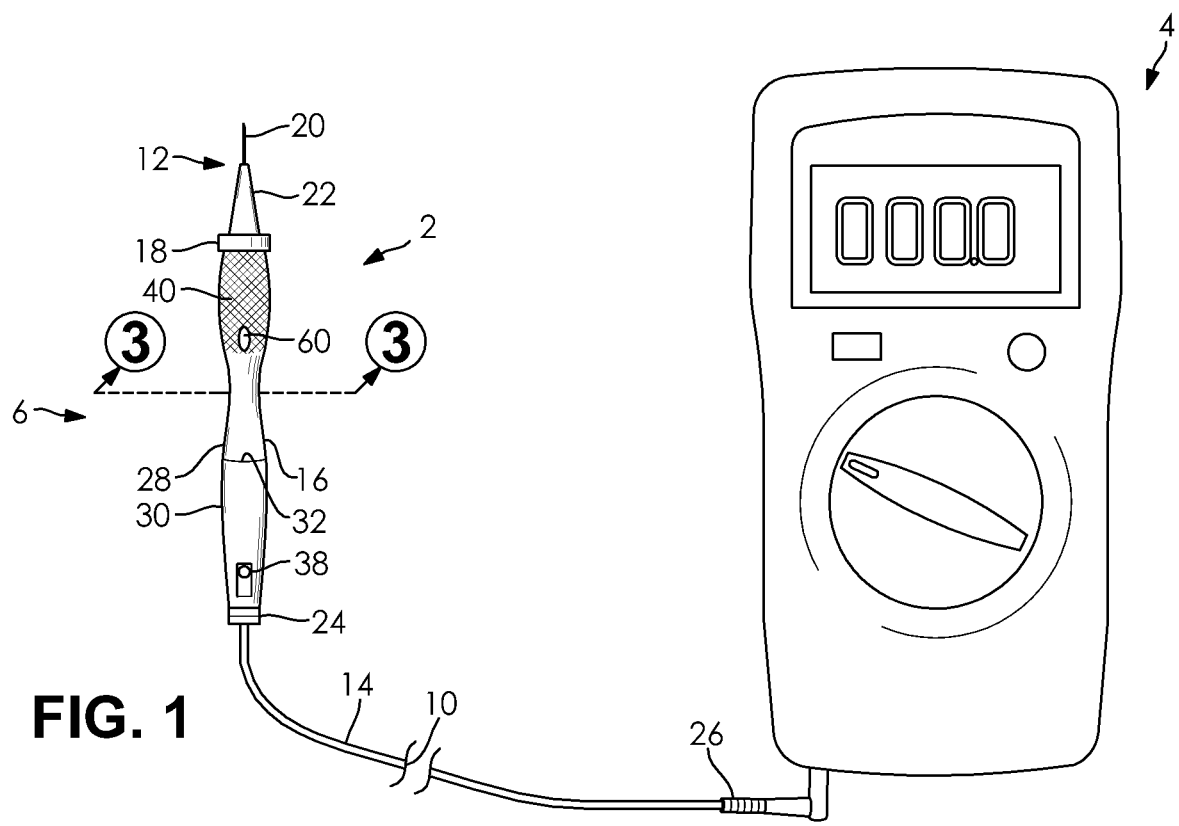
FIG. 1 is a front elevational view of an electrical testing device including a lighted probe according to one embodiment of the present disclosure, the electrical testing device shown as a multimeter.

The following detailed description and appended drawings describe and illustrate various embodiments of the invention. The description and drawings serve to enable one skilled in the art to make and use the invention and are not intended to limit the scope of the invention in any manner.

A lighted probe 2 for use in combination with an electrical testing device 4 such as a multimeter or other testing instrument, according to various embodiments of the present disclosure, is shown in FIGS. 1-7. The lighted probe 2 includes a main body 6, an integrated light source 8, and an electrical testing device wire 10 for signal or data transmission to the electrical testing device 4. Although the wire 10 is shown and described herein for the data transmission, it should be understood that the wire 10 may be substituted with a wireless transmitter or transceiver (not shown) for the data transmission in certain embodiments, as desired.

Figure 2:
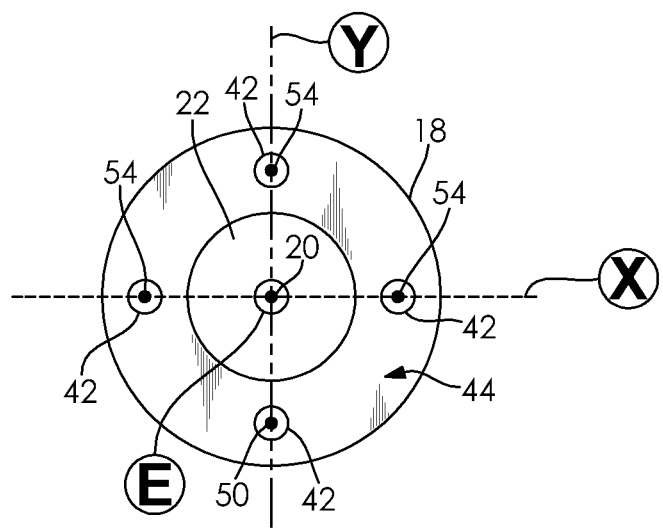
FIG. 2 is a top plan view of the lighted probe for the electrical testing device shown in FIG. 1.

With reference to FIGS. 1-3, the main body 6 of the lighted probe 2 according to one embodiment has a probe tip 12, an insulated wire cover 14, a handle portion 16, and a light source housing 18. The probe tip 12 has a conductive end 20 and a non-conductive end 22. The conductive end 20 is configured to contact a surface for testing and to conduct electrical signals to the electrical testing device 4. The non-conductive end 22 may be provided in the form of an element that rigidly supports the conductive end 20 of the lighted probe 2, for example, as shown in FIG. 3.

The non-conductive end 22 of the probe tip 12, as well as the insulated wire cover 14, the handle portion 16, and the light source housing 18 of the main body 6, may be made from one or more non-conductive materials including, but not limited to, plastic, rubber, and silicone. The conductive end 20 may be made from any suitable conductive material including, but not limited to, metals such as aluminum, copper, gold, stainless steel, and zinc. Other suitable materials for the conductive end 20 and the non-conductive end 22 of the probe tip 12 may also be selected by one skilled in the art within the scope of the present disclosure.

As further shown in FIGS. 1-3, the conductive end 20 extends outwardly from the non-conductive end 22 and away from the handle portion 16 of the main body 6. The conductive end 20 may be either magnetic or have a magnetic coating in certain embodiments. In further embodiments, the conductive end 20 may be configure to at least one of selectively retract into the non-conductive end 22 and extend outward from the non-conductive end 22 to various lengths using a button, slider, or any other mechanism (not shown). In a particular embodiment, the non-conductive end 22 of the lighted probe 2 is cone-shaped or frustoconical with the conductive end 20 extending out from a narrow end of the non-conductive end 22. It should be appreciated that the non-conductive end 22 is not limited to any particular shape, however, and one of ordinary skill in the art may select other suitable shapes of the non-conductive end 22 for rigidly holding the conductive end 20, as desired.

It should also be understood that the probe tip 12 may be removeable or interchangeable in certain embodiments. The probe tip 12 may be replaced with another interchangeable tip (not shown) having at least one of a different length, a different diameter, and a different color. Non-limiting examples of interchangeable tips include, but are not limited to, pin probes, piercing needle clamps, alligator clamps, lead extensions, clips, hooks, and other connectors. Other suitable types of interchangeable tips may also be employed.

The probe tips 12 may be removably connected to the light source housing 18 of the main body 6 using a snap, an interference fit or friction fit, a threaded connection, or any other appropriate connection means (not shown). In certain embodiments, the non-conductive end 22 may be removably connected to the housing 18, or the conductive end 20 may be removably connected to the conductive end 22, or both. In further embodiments of the disclosure, the probe tip 12 may also have a cap or cover (not shown) in order to protect the tip 22 in storage or when not being used.

With renewed reference to FIGS. 1 and 3, the wire 10 with the insulated wire cover 14 may have a handle connection end 24 and a testing instrument connection end 26. In a particular embodiment of the disclosure, the handle connection end 24 has an anti-kink flexible style connection. However, the handle connection end 24 is not limited to any particular connection style. The testing instrument connection end 26 in a particular embodiment of the disclosure is a universal connector adapted to connect to various testing instruments or device 4. The testing instrument connection end 26 may be any suitable connector including, but not limited to, a straight, 90-degree, swivel, or banana style connector. Other suitable types of the handle connection end 24 and the testing instrument connection end 26 may also be employed within the scope of the present disclosure.

The handle portion 16 of the main body 6 is disposed between the light source housing 18 and the handle connection end 24 to which the insulated wire cover 14 may be connected or disposed therethrough. As shown in FIGS. 1 and 3, in certain embodiments of the disclosure, the handle portion 16 includes a top section 28 and a bottom section 30. The top section 28 is disposed adjacent and removably connected to the bottom section 30. The top section 28 and the bottom section 30 of the handle portion 16 may be connected using an attachment means 32. For example, the attachment means 32 may include male threads 34 disposed on the top section 28 of the handle portion 16 and female threads 36 disposed on the bottom section 30 of the handle portion 16. The female threads 36 may be selectively received by the male threads 34 in order to connect the top section 28 with the bottom section 30.

It should be appreciated that the top section 28 and the bottom section 30 may be selectively disassembled, for example, by a user manually unscrewing the top section 28 from the bottom section 30 for the purpose of removing or replacing a light power source 56 (shown in FIG. 3) such as a battery disposed therein. An alternate embodiment is illustrated in FIG. 4, and shows the electric testing device 2 having an access door 37 that may be selectively disposed over a hole formed in a side of the handle portion 16 or the replacement of the light power source 56. One of ordinary skill in the art may also select other suitable types of the attachment means 32 including other threading types for the top and bottom sections 28, 30, or other arrangements for permitting the removal or replacement of the light power source 56 within the handle portion 16, as desired.

With renewed reference to FIGS. 1 and 3, the handle portion 16 may include a probe activation and deactivation switch 38. The switch 38 is configured to selectively allows current to travel from the conductive end 20 of the probe tip 12, through the wire 10, and to the electrical testing device 4 or other testing instrument when activated. The switch 38 may be provided in the form of a push button, a slide button, a rocker, or a dial as non-limiting examples.

In certain embodiments of the disclosure, as also shown in FIGS. 1 and 3, the handle portion 16 of the lighted probe 2 may include a non-slip grip 40 to facilitate the secure gripping of the handle portion 16 by the user in operation. The non-slip grip 40 may be provided in the form of a rubberized coating or sleeve disposed over the top section 28 of the handle portion 16, for example. The handle portion 16 may further have an ergonomically designed shape that may be round, oval, square or any other suitable shape configured to facilitate the secure gripping of the handle portion 16 by the user in operation. Other means for enhancing the ability of the user to grip and hold the lighted probe 2 may also be employed within the scope of the disclosure.

As shown in FIGS. 1-3, the light source housing 18 is disposed between the non-conductive end 22 of the probe tip 12 and the handle portion 16 of the lighted probe 2. The light source housing 18 may be generally cylindrical in shape in certain embodiments. However, a skilled artisan may also select other suitable shapes for the housing 18, as desired.

With reference to FIGS. 2 and 3, it should be understood that the light source housing 18 has a top surface 44 that faces away from the hand portion 16 of the lighted probe 2. At least one recess 42 may be formed in the top surface 44. In a particular embodiment of the disclosure, a plurality of recesses 42 is formed in the top surface 44 of the light source housing 18 in a cross-like configuration. For example, as shown in FIG. 2, a first pair of the recesses 42 may be disposed on a first axis Y and a second pair of the recesses 42 may be disposed on a second axis X, where the second axis X is oriented so that it is orthogonal with the first axis Y. Other suitable configurations for the recesses 42 may also be employed.

Referring now to FIG. 3, the wire 10 extends from the conductive end 20 of the probe tip 12, through the entirety of the non-conductive end 22 of the probe tip 12 and the light source housing 18, and through an entirety of the handle portion 16 to the handle connection end 24 of the handle portion 16. The wire 10 then extends to the testing instrument connection end 26 and is thereby configured to transmit the signal from the conductive end 20 of the probe tip 12 to the electrical testing device 4 or other testing instrument. It should be appreciated that at least the second of the wire between the handle connection end 24 and the testing instrument connection end 26 may have the insulated wire cover 14. However, the insulated wire cover 14 may also be disposed on at least a portion of the wire 10 disposed internal to each of the nonconductive end 22 of the probe tip 12 and the handle portion 16, as desired.

In a particular embodiment shown in FIG. 3, the wire 10 may have a first section 46 that is connected to a first circuit connector 48, and a second section 50 that is connected to a second circuit connector 52. The first circuit connector 48 and the second circuit connector 52 are selectively placed in electrical communication with one another where the top section 28 of the handle portion 16 and the bottom section 30 of the handle portion 16 are attached via the attachment mechanism 32 such as the threads. Where the first connector 48 and the second connector 52 are placed in electrical communication, the circuit from the conductive end 20 on the probe tip 12 to the electrical testing device 4 or other testing instrument may be completed. In other embodiments, for example, as shown in FIG. 5, the wire 10 may extend from the probe tip 12 of the lighted probe 2 to the electrical testing device 4 without interruption. In a further embodiment, the lighted probe 2 may be configured to transmit signals or data to the electrical testing device 4 or other testing instrument wirelessly, for example, using a Bluetooth connection or other wireless signal.

It should be understood that the integrated light source 8 of the present disclosure is housed in the light source housing 18. The integrated light source 8 includes at least one light 54. For example, the at least one light 54 may be in the form of a singular annular light or light ring arranged around the probe tip 12. In a particular embodiment, for example, as shown in FIGS. 2-6, the integrated light source 8 includes a plurality of lights 54. The plurality of lights 54 are arranged around the probe tip 12. The plurality of lights 54 may be disposed in the recesses 42 of the light source housing 18.

In one example, the lights 54 may be arranged around an entirety of (i.e., 360 degrees around) the non-conductive end 22 of the probe tip 12. In a particular example, the plurality of lights 54 may be arranged around the probe tip 12 in the cross-like configuration as shown in FIG. 2. The cross-like configuration is believed to minimize the formation of shadows and provides for a substantially even distribution of light to the probe tip 12. A skilled artisan may select any suitable number and other suitable arrangements for the plurality of lights 54 within the scope of the present disclosure.

The lights 54 are of a type and intensity sufficient to light the probe tip 12 of the lighted probe 2. As non-limiting example, the lights 54 may be any of light-emitting diodes (LED), xenon lights, halogen lights, and fiber optic lights. The lights 54 may also be round, square or any other suitable shape. Likewise, the lights 54 may be any appropriate size or color. The lights 54 may all be identical or each of the lights 54 may be different, as desired.

With renewed reference to FIG. 3, the integrated light source 8 is in selective electrical communication with the light power source 56. The light power source 56 is housed in the handle portion 16 of the lighted probe 2, and is configured to selectively supply electrical power to the lights 54. The light power source 56 may be housed in any other area of the main body 6, as desired. In an alternative example, the integrated light source 8 may be powered by the electrical testing device 4 or other testing instrument.

In a most particular embodiment, as shown in FIGS. 3 and 5, the light power source 56 is the replaceable battery. The replaceable battery may be an alkaline battery or rechargeable lithium ion, as non-limiting examples. In certain embodiments, the light power source 56 is connected to the integrated light source 8 by a battery wire 58. The integrated light source 8 may be activated and deactivated using a light source activation and deactivation switch 60, which be disposed on the main body 6, and in certain embodiments, the handle portion 16 of the electrical testing device 2. The light source activation and deactivation switch 60 may be one of a push button, a slide button, a rocker, and a dial as non-limiting examples. Once activated, the lights 54 are configured project one or more light beams 62 toward a testing site, and most particularly toward the probe tip 12 of the lighted probe.

In yet another embodiment, as shown in FIGS. 4-6, the top surface 44 of the light source housing 18 may be recessed and have a concave surface 64. The housing 18 may further have a light shield 66. The light shield 66 may circumscribe or extend about a periphery of the concave surface 64 and extend outwardly therefrom generally parallel with an elongate axis E (shown in FIG. 6) on which the probe tip 12 of the test probe is arranged. In certain embodiments, at least one of an inner surface 68 of the light shield 66 and the concave surface 64 of the housing 18 may have a light reflective material or coating so as to facilitate a projection of light beams from the lights 54 toward the probe tip 12 of the lighted probe 2.

In operation, the lighted probe 2 is device-agnostic and capable of connecting and transmitting signals or data to a wide range of electrical testing devices 4 or other testing equipment. The lighted probe 2 may be used in the automotive, electrical, space, marine, farming, fire safety, computer, or HVAC industry, as non-limiting examples.

Figure 7:
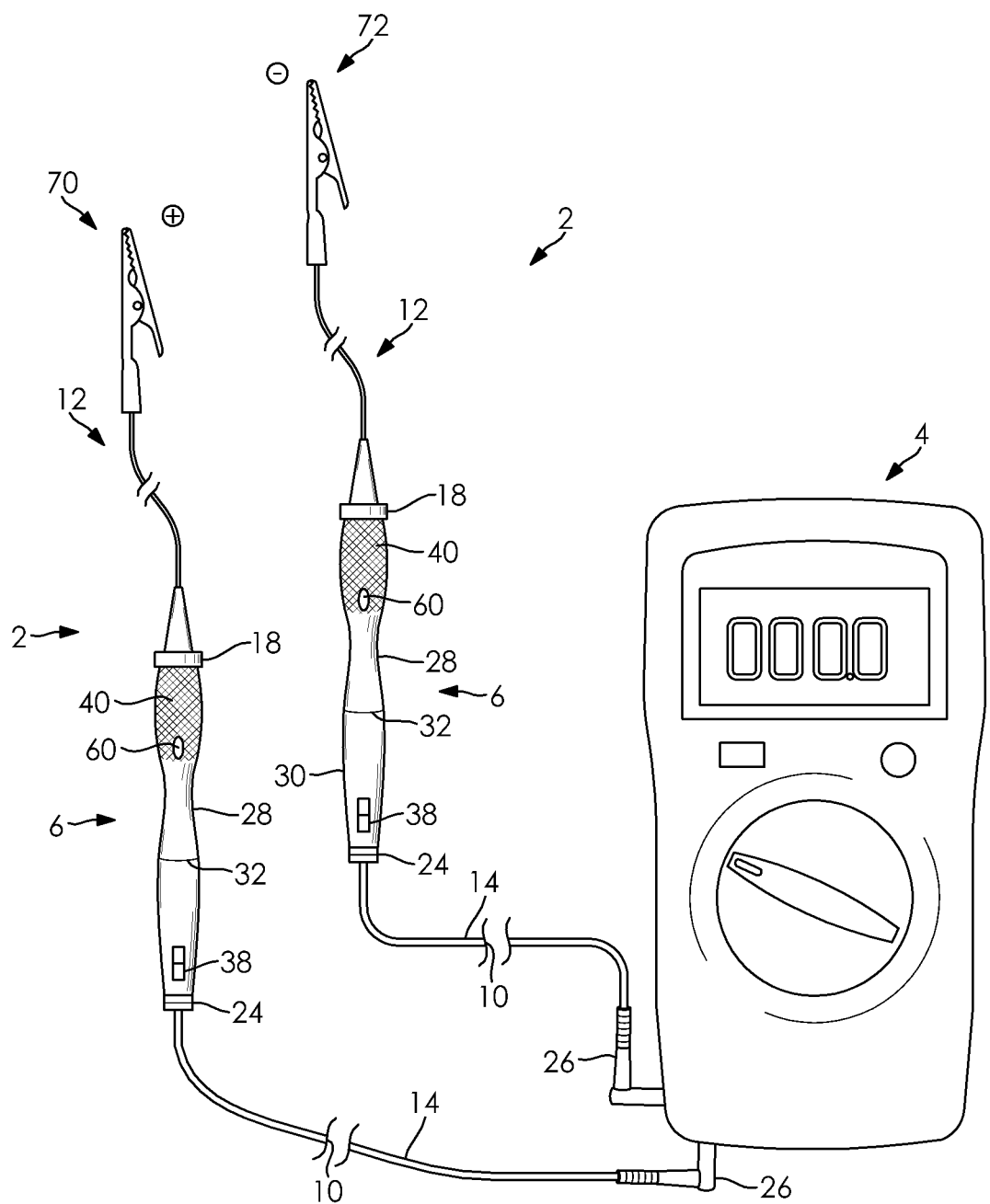
FIG. 7 is a front elevational view of the electrical testing device shown in FIG. 1, the electrical testing device shown with an additional lighted probe.

More than one of the lighted probes 2 may also be employed with the electrical testing device 4. As shown in FIG. 7, the user may operate both a first one of the lighted probes 70 configured for communication with a positive lead, and a second one of the lighted probes 72 configured for communication with a negative lead, for example, for purpose of testing voltage. Both the first lighted probe 70 and the second lighted probe 72 may be connected to the single electrical testing device 4 or other testing equipment as shown. The user may further select an interchangeable probe tip 12 based on the testing site and the signal or data to be acquired. Information is then transmitted along the wire 10, for example, once the user activates the electrical testing device activation and deactivation switch 38 and positions the first lighted probe 70 and the second lighted probe 72 on the desired areas of the testing site. In certain embodiments, at least one of the lighted probe 2 may include a "voltage is present" light (not shown) or have a speaker and controller (not shown) configured to make a "voltage is present" sound that is activated when voltage or any other desired measurement is detected.

Advantageously, in dark and difficult to see spaces the integrated light source 8 of the lighted probe 2 illuminates the testing site for the user. The lighted probe 2 provides for a focused lighting of the testing site by orienting the light beams 62 (shown in FIG. 6) toward the probe tip 12 of the lighted probe 2, while minimizing the scattering of the light beams 62 to other areas not at the probe tip 12 of the lighted probe 2. The user may easily and intuitively activate and deactivate the integrated light source 8 by pressing on the light source activation and deactivation button 60, which is conveniently positioned on the handle portion 16 of the main body 6 at a position designed to be near the thumb or forefinger of the user.

In most particular embodiments, the light power source 56 allows for the integrated light source 8 to be activated and deactivated independently from the electrical testing device 4 or other testing equipment. As such, the integrated light source 8 may be used regardless of whether power is being supplied to the electrical testing device 2 by the electrical testing device 4 or other testing equipment. This is especially helpful if illumination is required to locate a specific testing site prior to activating the electrical testing device 4 or other testing equipment, and for accurately positioning the probe tip 12 to make contact with the desired area of the testing site prior to activating the electrical testing device 4 or other testing equipment and collecting data.

Certain embodiments of the lighted probe 2 of the present disclosure may further have an automatic shut off timer (not shown) in electrical communication with the switch 60 for the integrated light source 8. The employment of the automatic shut off timer is particularly helpful in case the user fails to deactivate the integrated light source 8 using the light source activation and deactivation button 60 once the desired data has been collected and the job is completed.

It should be further appreciated that, as also described hereinabove, the lights 54 are positioned in the recesses 42 disposed in the top surface 44 of the light source housing 18 in order to more accurately direct or orient the light beams 62 along specific paths toward the conductive end 20 of the probe tip 12, and thereby militate against unintended illumination of areas other than the testing site.

In most particular embodiments, as shown in FIGS. 4-6, the concave surface 64 of the top surface 44 of the light source housing 18 is especially configured to orient the lights 54 at an angle, relative to the elongate axis E on which the probe tip 12 is disposed, that faces inwardly toward the conductive end 20 of the probe tip 12. For example, the light beams 62 produced by the lights 54 may be projected along paths are substantially parallel with an outer surface of the conical or frustoconical non-conductive end 22 of the probe tip 12, which extends outwardly from the light source housing 18 to the conductive end 20 of the probe tip 12 as show in FIG. 6. The light beams may be directed to, and intersect with, a terminal end of the conductive end 20 of the probe tip 12. As a result, the light beams 62 illuminate the testing area directly in front of the conductive end 20 of the probe tip 12.

It has been surprisingly found that the cross-like configuration of the lights 54 also provides illumination from 360 degrees around the probe tip 12, thereby illuminating the testing site from all directions and effectively eliminating shadows that otherwise might obscure the view of the testing site by the user. This permits the user to obtain more accurate signals or data, and also provides for a safer environment for taking measurements by minimizing the potential that the user will place the probe tip 12 at an undesired or unsafe location due to the undesired or unsafe location not being sufficiently illuminated. Additionally, the light shield 66 and the reflective material on the inner surface 68 of the light shield 66 further direct the light beams 62 to the test site and militate the lights 54 illuminating unintended areas.

In certain embodiments, as shown in FIGS. 3 and 5, the user may need to access the light power source 56 where, for example, the battery needs to be replaced. The male and female threads 34, 36 forming the attachment mechanism 32 shown in FIG. 3 allow the user to quickly and easily separate the top section 28 of the handle portion 16 from the bottom section 30 of the handle portion 16 in order to replace the light power source 56. In certain embodiments that include the top section 28 removably connected to the bottom section 30, the separation of the first and second wire sections 46, 50 must also be completed without damaging the wire 10. To facilitate this separation and a subsequent reconnection, the first and second circuit connectors 48, 52 may be made from a conductive material such as metal, zinc, aluminum, or stainless steel, as non-limiting examples. Where the light power source 56 is replaced and the bottom section 30 of the handle portion 16 is reconnected to the top section 28 of the handle portion 16, the first and second wire sections 46, 50 are reunited by the reconnection of the first and second circuit connectors 48, and the circuit for transmitting signals or data from the probe tip 12 to the electrical testing device 4 or other testing equipment is completed.

Alternatively, the first and second wire sections 46, 50 may be reconnected using any other appropriate means. For example, as shown in FIG. 5, the removable access door 37 may be employed by the user to easily access the light power source 56. In the embodiment shown in FIG. 5, the wire 10 extends continuously from the probe tip 12 to the electrical testing device 4 or other testing equipment. In certain embodiments of the disclosure, the lighted probe 2 may be further provided with a light source power indicator light, or a sound may be generated by the controller and speaker (not shown) to inform the user that the light power source 56 must be replaced.

It should be appreciated that the lighted probe 2 of the present disclosure is versatile and may be used with many different types of the electrical testing devices 4. The lighted probe 2 advantageously provide for an accurate and easy to use means for testing under lighted conditions for improved efficiency and safety. The lighted probe 2 described herein also advantageously contains the independently powered integrated light source 56 so that the lights 54 can be employed even where the lighted probe 2 is not in electrical communication with the electrical testing device 4 itself.

While certain representative embodiments and details have been shown for purposes of illustrating the invention, it will be apparent to those skilled in the art that various changes may be made without departing from the scope of the disclosure, which is further described in the following appended claims.

What is claimed is:

1. A lighted probe for an electrical testing device, comprising:
   a hollow main body having a first end, a second end, and a handle portion arranged on an elongate axis, the handle portion disposed between the first end and the second end, the handle portion having a top section and a bottom section that are removably connected;
   a light source housing disposed on the first end of the hollow main body;
   a probe tip having a conductive end and a non-conductive end, the conductive end arranged on the elongate axis of the hollow main body, and the non-conductive end of the probe tip disposed on the light source housing at the first end of the hollow main body;
   an integrated light source disposed in the light source housing of the hollow main body, the integrated light source configured to direct light beams toward the conductive end of the probe tip;
   a probe activation switch, wherein the probe activation switch is configured to selectively allow an electric current to travel from the conductive end of the probe tip through an electrical testing device wire and to the electrical testing device; and
   a light power source including at least one battery removably disposed between the top section and the bottom section of the handle portion of the hollow main body, wherein the electrical device wire includes a first section that is connected to a first circuit connector and a second section that is connected to a second circuit connector, the first circuit connector and the second circuit connector are selectively placed in electrical communication with one another when the top section and the bottom section of the handle portion are connected,
   wherein the probe tip is removably connected to the hollow main body and is interchangeable, the probe tip configured to be reversibly coupled to a surface for testing.

2. The lighted probe of claim 1, wherein the integrated light source is in selective electrical communication with a light power source.

3. The lighted probe of claim 2, further comprising a switch disposed on the handle portion of the main body and in electrical communication with the light power source and the integrated light source, and the switch configured to activate and deactivate the integrated light source.

4. The lighted probe of claim 1, wherein the top section and the bottom section are threadably connected.

5. The lighted probe of claim 1, wherein the integrated light source includes a plurality of lights arranged around the probe tip.

6. The lighted probe of claim 1, wherein the plurality of lights are oriented in a cross-like configuration at the light source housing adjacent the non-conductive end of the tip.

7. The lighted probe of claim 6, wherein the plurality of lights includes a first pair of lights and a second pair of lights, the first pair of lights disposed on a first axis and the second pair of lights disposed on a second axis, the first axis oriented orthogonal with the second axis.

8. The lighted probe of claim 7, wherein the light source housing has a top surface with at least one recessed portion, and each of the plurality of lights is disposed in the recessed portion.

9. The lighted probe of claim 8, wherein the at least one recessed portion includes a plurality of recessed portions, and each of the plurality of lights is disposed in one of the recessed portions of the light source housing.

10. The lighted probe of claim 9, wherein the top surface is a concave surface, and each of the plurality of lights is configured to direct light beams at an angle relative to the elongate axis of the hollow main body.

11. The lighted probe of claim 1, further comprising an electrical testing device wire disposed in the hollow main body and extending from the conductive end of the probe tip at the first end of the hollow main body, through nonconductive end of the probe tip and the hollow main body, and to the second end of the hollow main body, wherein the wire is configured to transfer one of a signal and data from the probe tip to the electrical testing device.

12. The lighted probe of claim 11, wherein the wire includes a first section connected to a first circuit connector, and a second section connected to a second circuit connector.

13. The lighted probe of claim 12, wherein, the first circuit connector and the second circuit connector are configured to be selectively placed in electrical communication with one another where the top section of the handle portion and the bottom section of the handle portion are connected.

14. The lighted probe of claim 11, wherein at least a portion of the electrical testing device wire has an insulated wire cover.

15. The lighted probe of claim 11, further comprising a switch disposed on the handle portion of the main body and in electrical communication with a light power source and an integrated light source, the switch not in electrical communication with the electrical testing device wire, and the switch configured to activate and deactivate the integrated light source.

16. The lighted probe of claim 1, wherein the conductive end of the tip is formed from at least one of copper, steel, and zinc, and the non-conductive end of the tip, the handle portion of the hollow main body, and the light source housing are formed from at least one of plastic, rubber, and silicone.

17. A lighted probe for an electrical testing device, comprising:
   a hollow main body having a first end, a second end, and a handle portion arranged on an elongate axis, the handle portion disposed between the first end and the second end, the handle portion having a top section and a bottom section that are removably connected;

a light source housing disposed on the first end of the hollow main body;

a probe tip having a conductive end and a non-conductive end, the conductive end arranged on the elongate axis of the hollow main body, and the non-conductive end of the probe tip disposed on the light source housing at the first end of the hollow main body;

an integrated light source disposed in the light source housing of the hollow main body, the integrated light source configured to direct light beams toward the conductive end of the probe tip, wherein the integrated light source includes a plurality of lights arranged around the probe tip, the plurality of lights are oriented in a cross-like configuration at the light source housing adjacent the non-conductive end of the tip, wherein the plurality of lights includes a first pair of lights and a second pair of lights, the first pair of lights disposed on a first axis and the second pair of lights disposed on a second axis, the first axis oriented orthogonal with the second axis;

an electrical testing device wire disposed in the hollow main body and extending from the conductive end of the probe tip at the first end of the hollow main body, through nonconductive end of the probe tip and the hollow main body, and to the second end of the hollow main body, wherein the electrical testing device wire is configured to transfer one of a signal and data from the probe tip to the electrical testing device;

a light power source including at least one battery removably disposed between the top section and the bottom section of the handle portion of the hollow main body in selective electrical communication with the integrated light source, the light power source being independent from a device power source connected to the electrical testing device wire; and a probe activation switch, wherein the probe activation switch is configured to selectively allow an electric current to travel from the conductive end of the probe tip through the electrical testing device wire and to the electrical testing device, wherein the electrical device wire includes a first section that is connected to a first circuit connector and a second section that is connected to a second circuit connector, the first circuit connector and the second circuit connector are selectively placed in electrical communication with one another when the top section and the bottom section of the handle portion are connected, wherein the probe tip is removably connected to the hollow main body and is interchangeable, the probe tip configured to be reversibly coupled to a surface for testing.

18. A lighted probe and electrical testing device combination, comprising:

a lighted probe having a first end, a second end, and a handle portion arranged on an elongate axis, the handle portion disposed between the first end and the second end, the handle portion having a top section and a bottom section that are removably connected, a light source housing disposed on a first end of a hollow main body, a probe tip having a conductive end and a non-conductive end, the conductive end arranged on the elongate axis of the hollow main body, and the non-conductive end of the probe tip disposed on the light source housing at the first end of the hollow main body, and an integrated light source disposed in the light source housing of the hollow main body, the integrated light source configured to direct light beams toward the conductive end of the probe tip;

an electrical testing device in wired communication with the lighted probe and receiving one of signals and data from the conductive end of the probe tip of the lighted probe;

a probe activation switch, wherein the probe activation switch is configured to selectively allow an electric current to travel from the conductive end of the probe tip through an electrical testing device wire and to the electrical testing device; and a light power source including at least one battery removably disposed between the top section and the bottom section of the handle portion of the hollow main body; and wherein the electrical device wire includes a first section that is connected to a first circuit connector and a second section that is connected to a second circuit connector, the first circuit connector and the second circuit connector are selectively placed in electrical communication with one another when the top section and the bottom section of the handle portion are connected, wherein the probe tip is removably connected to the hollow main body and is interchangeable, the probe tip configured to be reversibly coupled to a surface for testing.

* * * * *